United States Patent
Kneissl et al.

(10) Patent No.: US 7,138,648 B2
(45) Date of Patent: Nov. 21, 2006

(54) ULTRAVIOLET GROUP III-NITRIDE-BASED QUANTUM WELL LASER DIODES

(75) Inventors: Michael A. Kneissl, Mountain View, CA (US); David W. Treat, San Jose, CA (US)

(73) Assignee: Palo Alto Research Center Incorporated, Palo Alto, CA (US)

( * ) Notice: Subject to any disclaimer, the term of this patent is extended or adjusted under 35 U.S.C. 154(b) by 358 days.

(21) Appl. No.: 10/736,643

(22) Filed: Dec. 17, 2003

(65) Prior Publication Data

US 2005/0224781 A1 Oct. 13, 2005

(51) Int. Cl.
*H01L 27/15* (2006.01)

(52) U.S. Cl. .............. 257/14; 257/79; 257/103

(58) Field of Classification Search ............ 257/14, 257/79, 103
See application file for complete search history.

(56) References Cited

U.S. PATENT DOCUMENTS

| | | | |
|---|---|---|---|
| 5,006,908 A * | 4/1991 | Matsuoka et al. ............ 257/76 |
| 6,072,819 A | 6/2000 | Shakuda | |
| 6,118,801 A | 9/2000 | Ishikawa et al. | |
| 6,121,634 A * | 9/2000 | Saito et al. ............ 257/86 |
| 6,389,051 B1 | 5/2002 | Van de Walle et al. | |
| 6,597,017 B1 * | 7/2003 | Seko et al. ............ 257/79 |
| 2003/0132440 A1 | 7/2003 | Oku et al. | |

FOREIGN PATENT DOCUMENTS

| | | |
|---|---|---|
| EP | 0 908 988 A2 | 4/1999 |
| EP | 0 908 988 A3 | 4/1999 |
| EP | 908988 A2 * | 4/1999 |
| EP | 1 022 825 A1 | 7/2000 |

* cited by examiner

*Primary Examiner*—Thomas L. Dickey
(74) *Attorney, Agent, or Firm*—Oliff & Berridge, PLC

(57) ABSTRACT

A pair of undoped spacer layers are provided adjacent to, or near to, a single quantum well aluminum gallium nitride active region. In various exemplary embodiments, the undoped spacer layers are provided between the single quantum well aluminum gallium nitride active region and carrier confinement layers. The undoped spacer layers reduce the threshold current for the laser device and improve the output characteristics.

23 Claims, 9 Drawing Sheets

ULTRAVIOLET GROUP III-NITRIDE-BASED QUANTUM WELL LASER DIODES

REFERENCE TO GOVERNMENT CONTRACT

This invention was made with Government support by the DARPA SUVOS Program under SPAWAR Systems Center Contract No. N66001-02-C-8017, and the Government has certain rights in this invention.

BACKGROUND OF THE INVENTION

1. Field of Invention

This invention is directed to semiconductor laser diodes emitting in the ultraviolet region of the spectrum.

2. Description of Related Art

In recent years, gallium nitride-based compound semiconductors, such as GaN, InGaN, GaAlN, and InGaAlN, have received a great deal of attention as materials for violet- and blue-emitting semiconductor lasers. Semiconductor lasers using these materials in the multi-quantum well (MQW) active region are designed as short-wavelength laser sources. Hence, their output can be focused to small diameters. Owing to this advantage, these lasers are expected to be usable as light sources for high density information storage, such as in an optical disk.

Because of their compactness, low power consumption and longevity, UV semiconductor lasers can also enable other applications that are unrealizable by solid state or gas lasers. Such applications can include sources for compact bioagent detection systems, for optical biopsy by exciting fluorescence in human tissue, in dentistry (UV curing), and in ophthalmology (to detect some kinds of eye damage). UV lasers might also be of interest in biotechnology applications such as cross linking nucleic acids with polymers, exciting DNA or proteins, and more.

However, GaN materials systems present unique problems in terms of realizing a UV laser. In particular, large polarization fields exist for example, within the In(Al)GaN and (In)AlGaN layers of a multi-quantum well device. The polarization fields arise from the large pyroelectric and piezoelectric constants in these materials. The polarization charges at the heterostructure interfaces create polarization fields that spacially separate the negatively charged electrons from the positively charged holes. For example, for an InGaN film with 10% In, on a GaN template, the polarization field in the quantum well can be in the range 1.5 MV/cm. These polarization fields tend to separate the wavefunctions of the electrons and holes within a quantum well, which in turn tends to reduce the wavefunction overlap and thus the optical gain of the laser device.

Polarization effects are particularly detrimental for In(Al)GaN/(In)AlGaN multi-quantum wells, where the fields cause not only uneven carrier distribution within but also uneven carrier distribution between the quantum wells.

The high-band gap (In)AlGaN barriers between quantum wells (QW) add further to the uneven carrier distribution in the multi-quantum well (MQW) active region. High-band gap (In)AlGaN barriers are normally required to prevent carriers from leaking out of the quantum wells. However the high barriers will also prevent carriers from moving easily between quantum wells and therefore make it difficult to achieve a even distribution of carriers between quantum wells.

Unevenly distributed carriers lead to uneven gain, which results in higher threshold current densities and lower quantum efficiencies. In this case, the carrier distributions can be so non-uniform that one or more of the quantum wells in the active region is below the transparency threshold, which can even quench lasing.

The problem of uneven carrier distribution in the active region can be reduced by constructing single quantum well (SQW) devices, because the PN junction is directly placed at the quantum well. Since there is only one quantum well, uniform carrier injection is not a problem. In addition, the single quantum well (SQW) active region has a smaller volume compared to the multi-quantum well active region, so that fewer carriers are needed to produce gain. Therefore, the threshold current for lasing with a single quantum well active region is normally lower than that for an multi-quantum well active region, provided that the loss in the laser is low enough.

Alternatively one could also use a closely-spaced coupled quantum well (CQW) approach. In this case the barriers between the quantum wells are fairly thin and/or have a relatively low band gap-energy to provide sufficient coupling between the quantum wells. The carriers in the quantum wells can then easily redistribute either by tunneling between quantum wells or by a thermally activated process that allows them to cross the barriers. The PN junction including larger bandgap confinement layers is placed adjacent to the coupled quantum well region to allow efficient carrier injection and to prevent carrier leakage. This approach allows a higher gain, which might be important for high power operation or necessary if the loss in the laser is elevated.

SUMMARY OF THE INVENTION

One aspect of the design of such single quantum well or coupled quantum well devices, is the design of a carrier confinement structure, to contain the carriers within the active region, while not contributing to the loss in the device.

Therefore, a need exists to devise a single quantum well or coupled quantum well structure in the GaN materials systems, that results in a low threshold current operation.

This invention provides a single quantum well and coupled quantum well laser diode having undoped spacer layers provided between the active region and the carrier confinement layers.

This invention separately provides a single or coupled quantum well laser diode having a symmetric structure around the single quantum well.

This invention separately provides a single or coupled quantum well laser diode having an asymmetric structure around the single quantum well.

This invention separately provides a single or coupled quantum well laser diode, having undoped spacer layers that have a same composition as that of the carrier confinement layers.

This invention separately provides a single or coupled quantum well laser diode, having undoped spacer layers that have a different composition from that of the carrier confinement layers.

This invention separately provides a single or coupled quantum well laser diode, wherein the undoped spacer layer and carrier confinement layer provided above the active region, have a same composition as that of the undoped spacer and carrier confinement layers provided below the active region.

This invention separately provides a single or coupled quantum well laser diode, where the undoped spacer and carrier confinement layers provided above the active region have a different composition from that of the undoped spacer and carrier confinement layers provided below the active region.

In various exemplary embodiments according to this invention, a single quantum well or coupled quantum well laser diode active region is described which uses (indium) aluminum gallium nitride carrier confinement layers adjacent to the indium gallium nitride single or coupled quantum well to provide the necessary electron and hole confinement. The electron and hole confinement layers are partially doped with silicon or magnesium, to supply sufficient carrier confinement for electrons and holes. In various exemplary embodiments according to this invention, a portion of the confinement layers directly adjacent to the quantum well are left undoped, to reduce impurity scattering and prevent structural degradation of the single quantum well laser diode. In various exemplary embodiments according to this invention, the undoped spacer layers increase the gain and reduce the threshold current of the single or coupled quantum well laser diode.

These and other features and advantages of various exemplary embodiments of systems and methods according to this invention are described in, or are apparent from, the following detailed description of various exemplary embodiments of the systems and methods according to this invention.

BRIEF DESCRIPTION OF THE DRAWINGS

Various exemplary embodiments of devices, systems and/or methods according to this invention will be described in detail, with reference to the following figures, wherein.

DETAILED DESCRIPTION OF EXEMPLARY EMBODIMENTS

Figure 1:
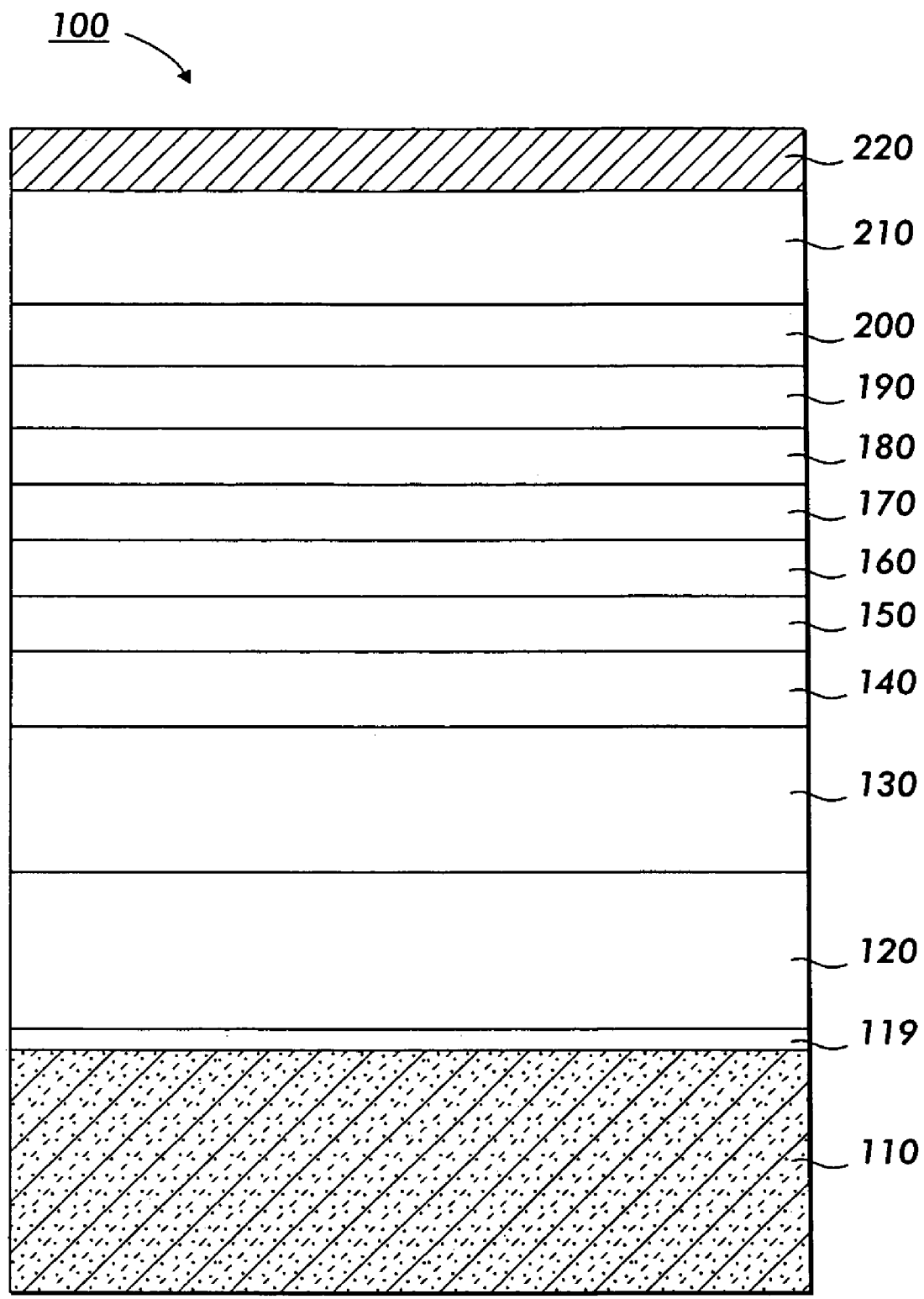
FIG. 1 is a cross-sectional view of a first exemplary embodiment of a layer structure of an ultraviolet group III–V nitride-based single quantum well laser diode according to this invention.

The short diffusion length of carriers in gallium nitride heterostructures requires that the carrier donor sites be located very near the quantum well active region, so that the carriers reach the active region before recombining. However, magnesium doping of a GaN heterostructure, which provides the positively-charged carriers (i.e., holes), has a very high ionization energy. For example, the ionization energy for Mg acceptor atoms in GaN is about 200 meV. As a result, for an Mg acceptor concentration of about $10^{20}$ atoms per cm$^3$, only $10^{18}$ holes per cm$^3$ are obtained. Furthermore, the Mg ionization energy in AlGaN compounds increases with increasing Al content at a rate of about 3 meV per percent mole fraction of aluminum, requiring even more donor atoms per generated carrier. Because only 1% of the donor atoms are ionized to produce a charge carrier, very high doping levels must be implemented in GaN or AlGaN films to generate sufficient carrier densities to produce gain.

However, doping concentrations in excess of $10^{20}$ atoms per cm$^3$ can substantially degrade the crystal lattice, as the dopant constitutes a 0.1% or more impurity ($10^{20}/10^{23}$) in the doped material. Distortion of the crystal lattice, resulting from the large concentration of dopant species incorporated into the lattice of the doped material, generate defects in the crystal lattice. A number of defects can form in GaN crystals at these high doping levels, for example, inversion domain boundaries, magnesium-nitride precipitates or point defects. The lattice defects cause the absorption edge to broaden to below the band gap and promotes non-radiative recombination, which in turn increases the intrinsic losses in the doped material.

Furthermore, ionized impurities near the quantum well active region can lead to electron and hole scattering, which in turn results in a broadening of the gain spectrum. Each of these mechanisms tends to increase the loss or decrease the gain of the device, increasing the laser threshold current, or even completely inhibiting the onset of laser action.

Therefore, while it is desirable to place the donor atoms close to the active region because of the short diffusion lengths, these same donor atoms cause a reduction in the gain of the device because of their deleterious effects on the surrounding crystal lattice and electronic properties of the quantum wells In various exemplary embodiments of laser devices according to this invention, a layer near to or adjacent to the active region is left undoped. Therefore, this layer has fewer, and preferably significantly fewer lattice defects, and ideally is free of lattice defects, and impurity scattering is reduced, preferably significantly reduced, and ideally eliminated. In various exemplary embodiments of the laser devices according to this invention, at the same time, the remainder of the carrier confinement layer remains highly doped, to generate the required carrier density and to provide sufficient band offset to effectively confine the carriers to the active region.

As a result, compared to the prior art structures which do not include the undoped spacer layers, a higher gain, lower threshold current single or coupled quantum well laser diode can be obtained.

FIG. 1 shows one exemplary embodiment of the cross-sectional structure of the III–V nitride laser device 100 according to this invention. The layer structure 100 may be fabricated using metal-organic chemical vapor deposition (MOCVD). The III–V nitride laser device 100 is grown, for example, on a C-face (0001) or an A-face (1120) oriented sapphire ($Al_2O_3$) substrate 110 on which succession of semiconductor layers is, for example, epitaxially deposited. Other possible substrate materials include, for example, silicon carbide (e.g., 6H—SiC or 4H—SiC), GaN, AlGaN or AlN or silicon.

In case of sapphire, SiC, or silicon substrate, a low-temperature nucleation layer 119 is typically first deposited. The nucleation layer can be GaN, InGaN, AlGaN or AlN and is typically about 10–30 nm thick and deposited at a temperature of about 500° C. to about 700° C. It is also possible to deposit a high temperature AlN nucleation layer 119 on sapphire or SiC. The nucleation layer is typically about 100–1000 nm thick and deposited at a temperature of about 1000° C. to about 1300° C. Homoepitaxial growth on AlN, AlGaN or GaN substrate does normally not require such a nucleation layer and growth can be directly initiated with layer 120.

A first III–V nitride layer 120 is formed on or over the substrate 110. The first III–V nitride layer 120 is an n-type (Al)GaN silicon doped buffer layer, where the buffer layer serves as a current spreading layer. In various exemplary embodiments, the first III–V nitride layer 120 has an n-doping concentration in the range of about $10^{16}$ to about $10^{20}$ $cm^{-3}$. In various exemplary embodiments, the doping concentration is about $5 \times 10^{18}$ $cm^{-3}$. In such exemplary embodiments, the first III–V nitride layer 120 has a thickness of from about 1 μm to about 10 μm. In the case of an Si-doped AlGaN current spreading layer, the aluminum composition would be typically similar to or slightly lower than the cladding layers.

A second III–V nitride layer 130 is formed on or over the first III–V nitride layer 120. The second III–V nitride layer 130 is a first cladding layer. In various exemplary embodiments, the second III–V nitride layer 130 is an n-type AlGaN cladding layer which is silicon-doped, with an aluminum content larger than a third III–V nitride layer 140 (described below). In various exemplary embodiments, the aluminum content of the AlGaN cladding layer 130 is about 10% to about 16%. In general, the aluminum content of the cladding layer will vary according to the emission wavelength of the device. Generally, shorter wavelength UV lasers will require higher ranges of aluminum content. In some exemplary embodiments, the aluminum content is about 13%. The AlGaN cladding layer 130 typically has an n-doping concentration of about $10^{16}$ to about $10^{20}$ $cm^{-3}$. In various exemplary embodiments, the doping concentration is about $1 \times 10^{18}$ $cm^{-3}$. The second III–V nitride layer 130 has a thickness of from about 0.2 μm to about 2 μm.

The third III–V nitride layer 140, which is a first waveguide layer, is formed on or over the second III–V nitride layer 130. In various exemplary embodiments, the third III–V nitride layer 140 is an n-type AlGaN:Si layer in which the aluminum content is chosen such that the refractive index of the third III–V nitride layer 140 is larger than that of the second III–V nitride layer 130 and is smaller than that of an aluminum gallium nitride quantum well in an active region 170 (described below). In various exemplary embodiments, the aluminum content is about 5% to about 7%, and in some exemplary embodiments is about 6%. In various exemplary embodiments, the thickness of the third III–V nitride layer 140 is from about 0.05 μm to about 0.2 μm, and has an n-doping concentration of about $10^{16}$ to about $10^{20}$ $cm^{-3}$. In various exemplary embodiments, the doping concentration of the third III–V nitride layer 140 is about $1 \times 10^{17}$ $cm^{-3}$.

A fourth III–V nitride layer 150 is formed over the first waveguide layer 140. The fourth III–V nitride layer 150 acts as a first carrier confinement layer. The fourth III–V nitride layer 150 has a higher band gap than that of the quantum well active region 170. In various exemplary embodiments, the band gap difference between the fourth III–V nitride layer 150 and the quantum well active region 170 is about 0.5 eV. In various exemplary embodiments, the fourth III–V nitride layer 150 is n-type aluminum gallium nitride with silicon doping with an aluminum mole fraction in the range from x=0.05 to x=0.4, i.e., where the aluminum content is about 5% to about 40%. In such exemplary embodiments, the overall thickness of the fourth III–V nitride layer 150 is typically from about 5 nm to about 100 nm, and the fourth III–V nitride layer typically has an n-doping concentration of about $10^{18}$ to about $10^{21}$ $cm^{-3}$. In various exemplary embodiments, the doping concentration of the fourth III–V nitride layer 150 is about $1 \times 10^{19}$ $cm^{-3}$.

A fifth III–V nitride layer 160 is deposited on or over the first confinement layer 150. The fifth III–V nitride layer 160 is an undoped (indium) aluminum gallium nitride spacer layer, and may be from about 0 nm to about 10 nm thick. Here, the term "undoped" means that the layer is not intentionally doped. Nitride materials are often unintentionally doped, such as, for example, due to background doping, mostly oxygen, silicon and carbon, and are n-type, where the typical n-doping levels are $10^{15}$ to $10^{17}$ $cm^{-3}$. These doping levels, however are low enough to not affect the lattice integrity or the performance of the laser device 100. The aluminum content of the undoped spacer layer 160 is lower than or equal to that of the first confinement layer 150. In various exemplary embodiments, the aluminum content of the undoped spacer layer 160 is in the range of about 5% to about 40%.

As indicated above, the quantum well active layer 170 is formed on or over the fifth III–V nitride layer 160. In various exemplary embodiments, the quantum well active layer 170 is formed using a single indium gallium nitride quantum well. In various exemplary embodiments, the quantum well may have a thickness of from about 1 nm to about 20 nm. The aluminum gallium nitride quantum well 170 is typically un-doped. However, in some embodiments, the indium gallium nitride quantum well 170 is Si-doped or partially Si-doped. When doped, typical Si doping concentrations are between about $10^{16}$ to about $10^{20}$ $cm^{-3}$. In various exemplary embodiments, the Si doping concentration is about $5 \times 10^{18}$ $cm^{-3}$. It should be appreciated that, in general, the composition of the indium gallium nitride quantum well 170 is chosen such that the band gap energy is smaller than that of the waveguide and cladding layers 140 and 130. Depending on the targeted emission wavelength the quantum well can also be formed using gallium nitride, aluminum gallium nitride, or indium aluminum gallium nitride. One exemplary embodiment of a quantum well active region 170 for a laser emitting at 340 nm contains a single quantum well of aluminum gallium nitride with the aluminum content of about 12%. The same emission wavelength can also be achieved using an $In_xAl_yGa_{1-x-y}N$ quantum well with an indium composition of x=2% and an aluminum composition of y=16% (see also table 2). Typically, each of the confinement layer 150 and the undoped spacer layer 160 will have an aluminum content that is about 10% to about 30% higher than that of the quantum well active region 170.

A sixth III–V nitride layer 180 is formed on or over the quantum well active region 170. In various exemplary embodiments, the sixth III–V nitride layer 180 is undoped (indium) aluminum gallium nitride, which may be from about 0 nm to about 10 nm thick. As indicated above with respect to the undoped spacer layer 160, the term "undoped" means that the layer is not intentionally doped. Nitride materials are often unintentionally doped (background doping, mostly oxygen or silicon), and are n-type, where the typical n-doping levels are $10^{15}$ to $10^{17}$ cm$^{-3}$. These doping levels, however are low enough to not affect the lattice integrity or the performance of the laser device 100. The aluminum content of the undoped spacer layer 180 is lower or equal to that of the second confinement layer 190. In various exemplary embodiments, the aluminum content of the undoped spacer layer 180 is in the range of about 5% to about 40%. Therefore, this structure contains an undoped spacer layer adjacent to the quantum well on both the n-side and the p-side. The composition of the spacer layer 180 can vary as well as the composition of the first and second confinement layers 150 and 190, as will be described in more detail below.

A seventh III–V nitride layer 190 is formed on or over the spacer layer 180. The seventh III–V nitride layer 190 also acts as a second carrier confinement layer. The seventh III–V nitride layer 190 has a higher band gap than the quantum well active region 170. In various exemplary embodiments, the band gap difference between the quantum well active region 170 and the second carrier confinement layer 190 is about 0.5 eV. In various exemplary embodiments, the seventh III–V nitride layer 190 is p-type aluminum gallium nitride magnesium-doped with an aluminum mole fraction in the range x=0.05 to x=0.4. In such exemplary embodiments, the overall thickness of the seventh III–V nitride layer 190 is typically from about 5 nm to about 20 nm, and the seventh III–V nitride layer 190 typically has a p-doping concentration of about $10^{18}$ to about $10^{21}$ cm$^{-3}$. In various exemplary embodiments, the doping concentration is about $1 \times 10^{20}$ cm$^{-3}$.

An eighth III–V nitride layer 200 is formed on or over the seventh III–V nitride layer 190. The eighth III–V nitride layer 200 acts as a second waveguide layer. In various exemplary embodiments, the eighth III–V nitride layer 200 is a p-type aluminum gallium nitride magnesium-doped material. In such exemplary embodiments, the aluminum content is chosen such that the refractive index of the eighth III–V nitride layer 200 is larger than that of the seventh III–V nitride layer 190, and is smaller than that of the aluminum gallium nitride quantum well in the active region 170. In various exemplary embodiments, the aluminum content of the eighth III–V AlGaN layer is about 5% to about 7%, and in some exemplary embodiments, is about 6%. In various exemplary embodiments, the thickness of the eighth III–V nitride layer 200 is from about 0.05 μm to about 0.2 μm and the eighth III–V nitride layer 200 has a p-doping concentration of about $10^{16}$ to about $10^{20}$ cm$^{-3}$. In various exemplary embodiments, the doping concentration is about $1 \times 10^{18}$ cm$^{-3}$.

A ninth III–V nitride layer 210 is formed on or over the eighth III–V nitride layer 200. The ninth III–V nitride layer 210 is a second cladding layer. In various exemplary embodiments, the ninth III–V nitride layer 210 is a p-type aluminum gallium nitride cladding layer. In various exemplary embodiments, the ninth III–V nitride layer 210 has a thickness of from about 0.2 μm to about 2 μm. In various exemplary embodiments, the ninth layer III–V nitride layer 210 is formed using p-type aluminum gallium nitride:magnesium, where the aluminum content is larger than that of the eighth III–V nitride layer 200. In various exemplary embodiments, the aluminum content of the ninth III–V cladding layer is about 10% to about 16%, and in some exemplary embodiments is about 13%. In various exemplary embodiments, the ninth layer 210 has a p-doping concentration of about $10^{16}$ to about $10^{21}$ cm$^{-3}$. In various exemplary embodiments, the doping concentration is about $5 \times 10^{19}$ cm$^{-3}$.

A tenth III–V nitride layer 220 is formed on or over the ninth III–V nitride layer 210. The tenth III–V nitride layer 220 is a p-doped gallium nitride:magnesium layer 220 and provides a low resistance metal electrode contact. In various exemplary embodiments, the tenth III–V nitride layer 220 has a thickness of from about 5 nm to about 200 nm. The tenth layer 220 has a p-doping concentration of about $10^{16}$ to about $10^{21}$ cm$^{-3}$. In various exemplary embodiments, the doping concentration is about $1 \times 10^{20}$ cm$^{-3}$.

Figure 2:
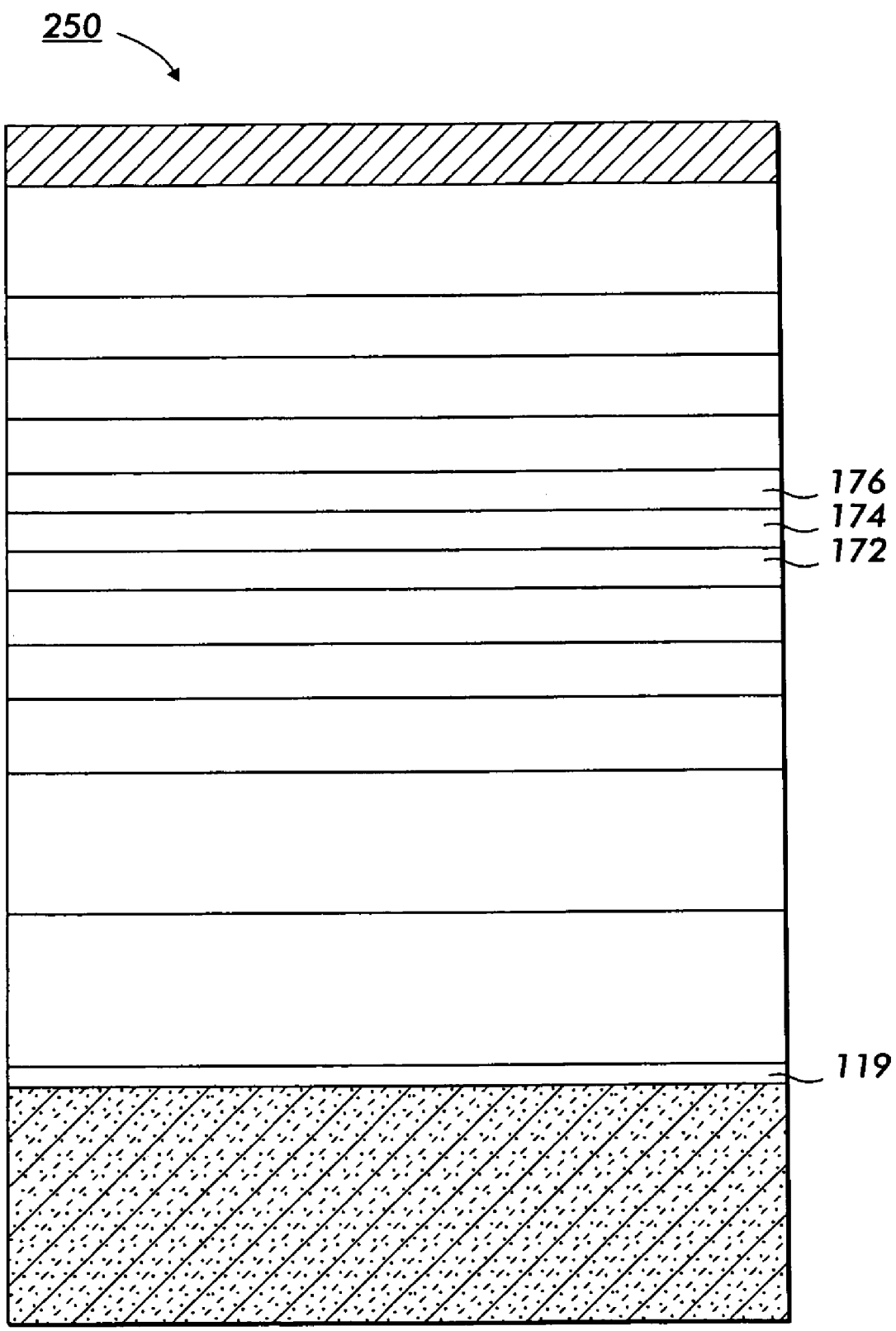
FIG. 2 is a cross-sectional view of a first exemplary embodiment of a layer structure of an ultraviolet group III–V nitride-based double quantum well laser diode according to this invention.

FIG. 2 shows one exemplary embodiment of an ultraviolet group III–V nitride based double quantum well (DQW) laser diode according to this invention. The double quantum well active layer is formed on or over the undoped spacer layer. In various exemplary embodiments, the quantum well active layer 170 is formed using two indium gallium nitride quantum wells 172 and 176 separated by an (In)AlGaN barrier 174. In various exemplary embodiments, the quantum well may have a thickness of from about 1 nm to about 20 nm. In various exemplary embodiments, the barriers may have a thickness of from about 1 nm to about 100 nm. The aluminum composition of the barrier layer will be in the range of 0% (GaN barrier) to 40%. The band gap of the barrier layer will be typically much smaller than the band gap of the confinement and spacer layers. It should be appreciated that it is desirable, but not necessary, that the barrier is either low enough or thin enough to enable efficient coupling between the quantum wells. Carrier redistribution can occur either by tunneling through a thin barrier or by a thermally-activated process where the carriers have enough energy to cross the low energy barrier. An example for an double quantum well active region of a 370 nm laser structure would be an InGaN quantum well with In content of 2% and a thickness of 4 nm, and AlGaN barrier with Al content of 6% and a thickness of 5 nm.

The indium gallium nitride quantum wells and barriers are typically un-doped. However, in some embodiments, the indium gallium nitride quantum well or barriers are Si-doped or partially Si-doped. When doped, typical Si doping concentrations are between about $10^{16}$ to about $10^{20}$ cm$^{-3}$. In various exemplary embodiments, the Si doping concentration is about $5 \times 10^{18}$ cm$^{-3}$. It should be appreciated that, in general, the composition of the indium gallium nitride quantum wells is chosen such that the band gap energy is smaller than that of the waveguide and cladding layers and has a band gap of the desired emission wavelength of the laser.

Figure 3:
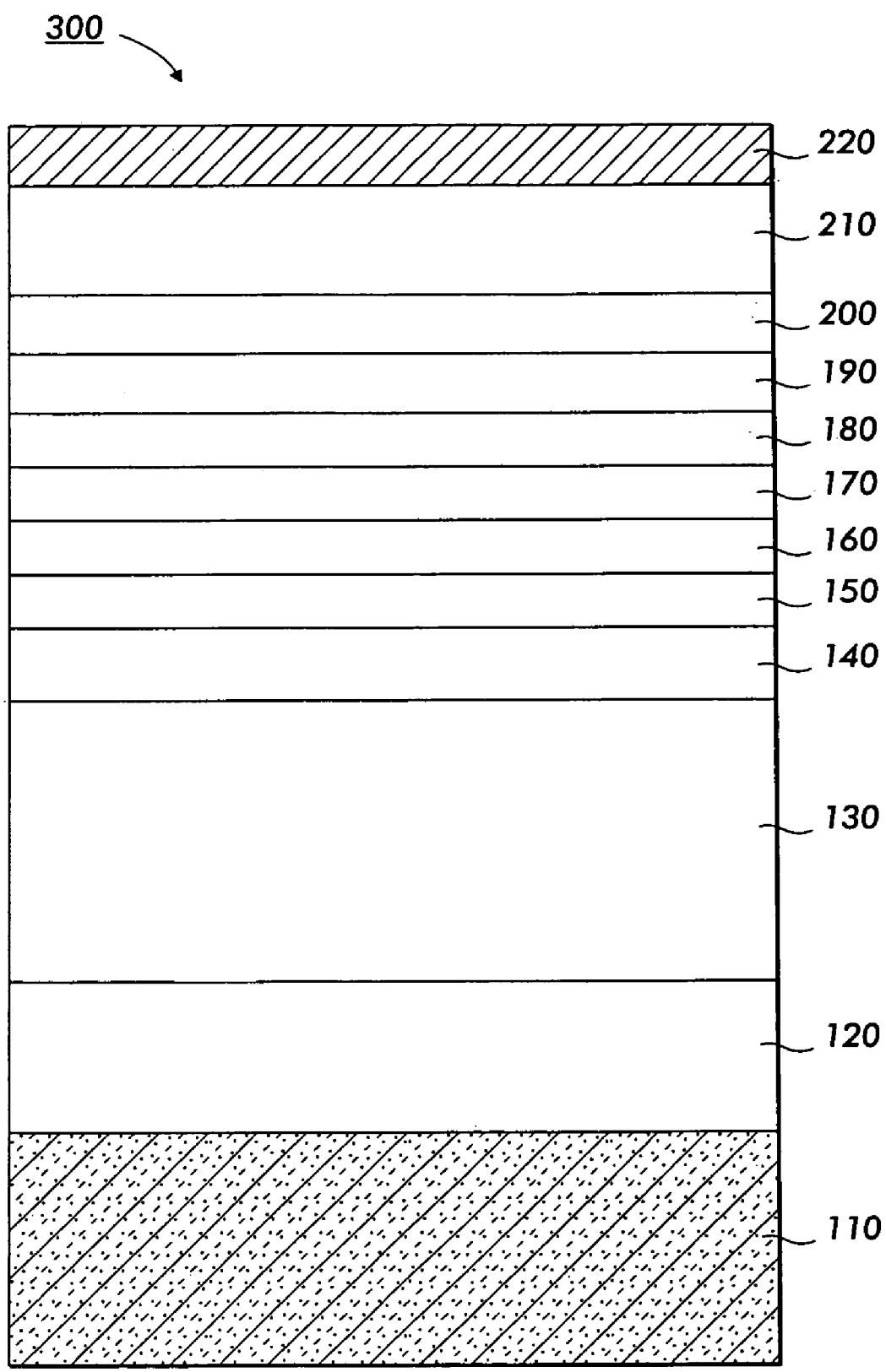
FIG. 3 is a cross-sectional view of a second exemplary embodiment of a layer structure of an ultraviolet group III–V nitride based single quantum well laser diode, according to this invention.

Depending on the targeted emission wavelength the quantum well can also be formed using gallium nitride, aluminum gallium nitride, or indium aluminum gallium nitride. One exemplary embodiment of a quantum well active region for a laser emitting at 340 nm is shown in FIG. 3. The quantum well active region is formed by aluminum gallium nitride with an aluminum content of about 12%. The same emission wavelength can also be achieved using an In$_x$A-

$In_yGa_{1-x-y}N$ quantum well with an indium composition of x=2% and an aluminum composition of y=16% (see also Table 2).

Typically, each of the confinement layer and the undoped spacer layer will have an aluminum content that is about 10% to about 30% higher than that of the quantum well active region.

In various exemplary embodiments, the sapphire substrate wafer 110 is of standard specifications, including an epitaxial polish on one side and a typical thickness of about 0.25 µm to about 0.43 µm (10 mil to 17 mil). The substrate temperatures during growth of the gallium nitride, AlN and aluminum gallium nitride layers is typically about 1000° C. to about 1300° C. In addition, the reactor pressure may be controlled between about 50 Torr and about 740 Torr. As organometallic precursors for the metal organic chemical vapor deposition (MOCVD) growth, TMGa (trimethylgallium), TMAl (trimethylaluminum), TMIn (trimethylindium) and TEGa (triethylgallium) are used for the group III elements and $NH_3$ (ammonia) is used as the nitrogen source. Hydrogen and/or nitrogen are used as carrier gases for the organometallic precursor gases. For the n-doping, 100 ppm $SiH_4$ is diluted in $H_2$. Examples of n-type dopants include, but are not limited to, Si, O, Se, and Te. For the p-doping, $Cp_2Mg$ (cyclopentadienylmagnesium) is used. Examples of p-type dopants include, but are not limited to, Mg, Ca, C and Be. In various exemplary embodiments, the overall height of the structure is about 1 µm to about 10 µm.

FIG. 3 shows one exemplary embodiment 300 of an ultraviolet group III–V nitride based single quantum well laser diode, which has been grown on an AlN substrate. The AlN substrate 110 does not require a nucleation layer. Lasers grown on AlN substrates have much lower dislocation densities. The lattice and thermal mismatch for In AlGaN heterostructures grown on AlN is also much smaller than for sapphire. In addition, the thermal conductivity of AlN substrates is much higher than sapphire. Drawbacks of AlN substrate are their current limited availability and higher cost.

Figure 4:
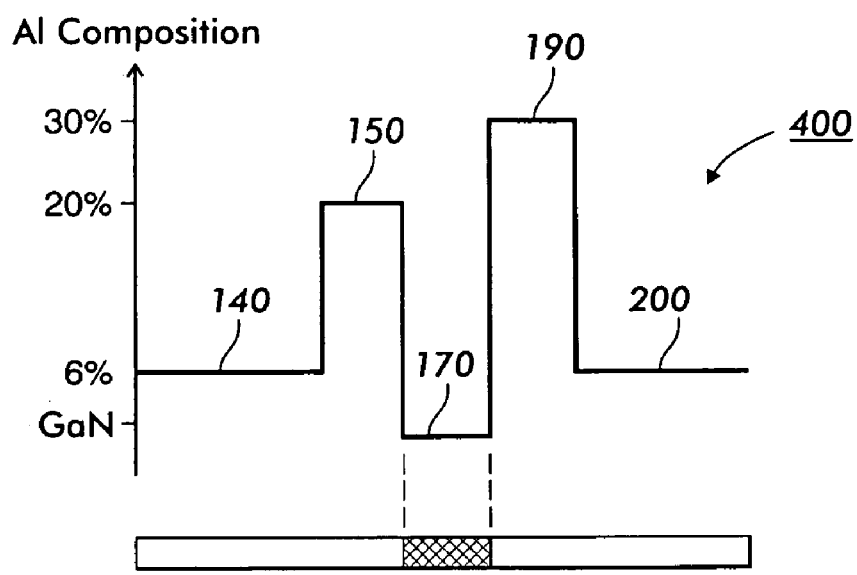
FIG. 4 is a composition profile of a conventional UV indium gallium nitride single quantum well active regions with AlGaN confinement and spacer layer configurations.

FIG. 4 shows a composition profile of a conventional InGaN single quantum well laser diode 400. The cross-hatching in the bar located beneath the composition profile in FIG. 4, as well as in FIGS. 5–9, indicates the regions in the composition profile that are undoped. In particular, this conventional InGaN single quantum well laser diode does not have undoped spacer layers between the single quantum well 170 and the carrier confinement layers 150 and 190. In this conventional InGaN single quantum well laser diode 400, the thickness of each of the carrier confinement layers 150 and 190 is between about 5 nm and about 50 nm, and typically between about 10 nm and about 20 nm. In the example shown in FIG. 4, the AlGaN structure 400 is asymmetric, with the n-side carrier confinement layer 150 having an aluminum content of about 20% and the p-side carrier confinement layer 190 having an aluminum content of about 30%. Since the hole effective mass (~2*$m_0$, where $m_0$ is the electron rest mass) is much higher than the electron effective mass (~0.2*$m_0$) the barrier height on the lower (Si-doped) side of the quantum well can be somewhat lower than on the Mg-doped side. Since it gets more difficult to grow AlGaN films with good morphology and the lattice mismatch increases at higher aluminum compositions it can be beneficial to have a lower Al composition in the Si-doped carrier confinement layer. Furthermore the strength of the polarization field in the quantum wells will depend on the quantum well/barrier composition difference and a smaller composition difference would result in reduced polarization fields. The asymmetry can be used to tailor the optical properties, such as, for example, transition energies of the laser diode. However, it is also possible to have symmetric composition profiles for the carrier confinement layers.

In this conventional InGaN single quantum well laser diode 400, the electron and hole confinement layers 150 and 190 are highly doped with either silicon or magnesium to provide sufficient carrier confinement for the electrons and holes. The doping levels in these layers needs to be very high to provide the necessary band offset for the respective carriers. In this conventional InGaN single quantum well laser diode 250 shown in FIG. 4, typical p-doping levels for the p-side carrier confinement layer 190 are between about $1 \times 10^{19}$ $cm^{-3}$ to about $1 \times 10^{20}$ $cm^{-3}$, while typical n-doping levels for the n-side carrier confinement layer 150 are between about $1 \times 10^{18}$ $cm^{-3}$ to about $3 \times 10^{19}$ $cm^{-3}$. However, as explained above, these high doping levels lead to structural degradation and impurity scattering. In addition, ionized impurities close to the quantum well will result in impurity scattering of the electron and holes in the quantum wells and to a broadening of the gain spectra. Both effects will reduce the gain and increase the current threshold of the InGaN single quantum well laser diode 400 shown in FIG. 4.

Figure 5:
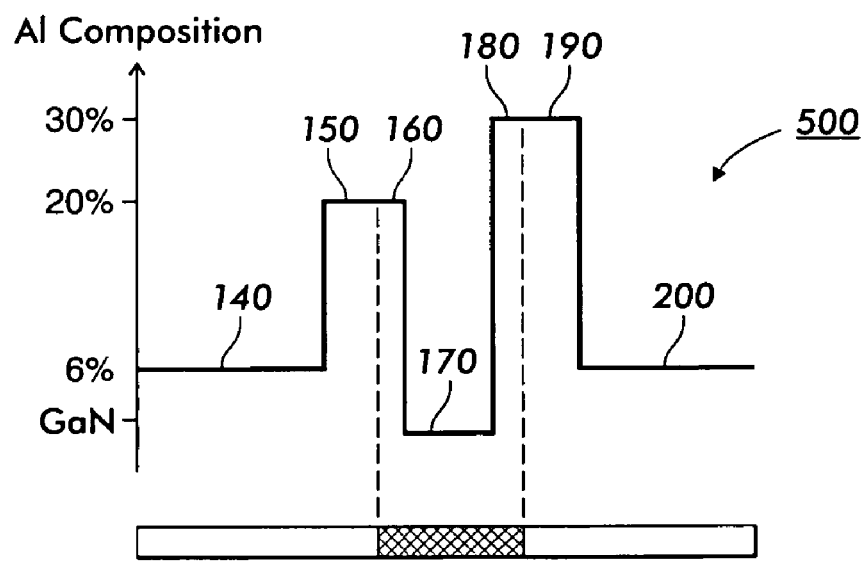
FIG. 5 is a composition profile of a first exemplary embodiment of a UV indium gallium nitride single quantum well active region with adjacent undoped spacer layers according to this invention.

To alleviate these effects, in exemplary embodiments of the laser devices according to this invention, narrow regions of undoped material are left adjacent to the single quantum well active region 170 to form the undoped spacer layers 160 and 180. FIG. 5 shows a composition profile of a first exemplary embodiment of such a laser device 500 according to this invention. As shown in FIG. 5, the composition of the undoped spacer layers 160 and 180 may be identical to that of the carrier confinement layers 150 and 190, in terms of the gross aluminum content. However, the aluminum content of the p-side carrier confinement layer 190 may be different from the aluminum content of the n-side carrier confinement layer 150, so that the laser device 500 is asymmetrical. As shown in FIG. 5, the aluminum content for the n-side carrier confinement layer 150 is about 20%, while the aluminum content for the p-side carrier confinement layer 190 is about 30%. The n-side waveguide layer 140 and the p-side waveguide layer 200, which are outside of the carrier confinement layers 150 and 190, have an aluminum content of 6%.

One difference between the single quantum well laser diode structure 500 shown in FIG. 5 and the conventional single quantum well laser diode structure 400 shown in FIG. 4 is the presence of the undoped spacer layers 160 and 180 adjacent to the single quantum well active region 170. However, as a result of the undoped spacer layers 160 and 180, the threshold current for lasing will be lower than that of the conventional single quantum well laser diode structure 400 shown in FIG. 4. The threshold current without a spacer, as illustrated in the device of FIG. 4, is larger than 50 $kA/cm^2$. By inserting a thin undoped spacer layer in the range of 3–6 nm (as illustrated in the device of FIG. 5) the threshold current density reaches a minimum of around 5 $kA/cm^2$, which is an order of magnitude lower than without the spacer layer.

Figure 6:
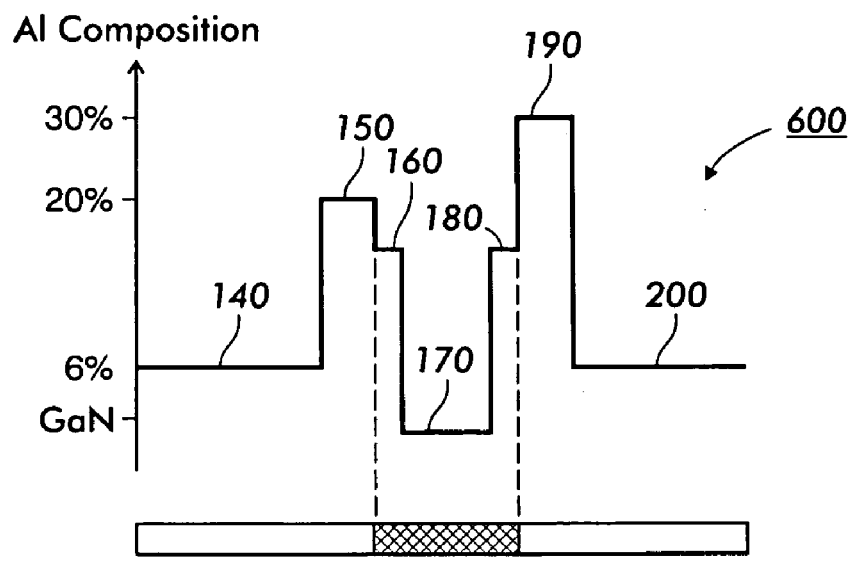
FIG. 6 is a composition profile of a second exemplary embodiment of a UV indium gallium nitride single quantum well active region with adjacent undoped spacer layers according to this invention.
Figure 7:
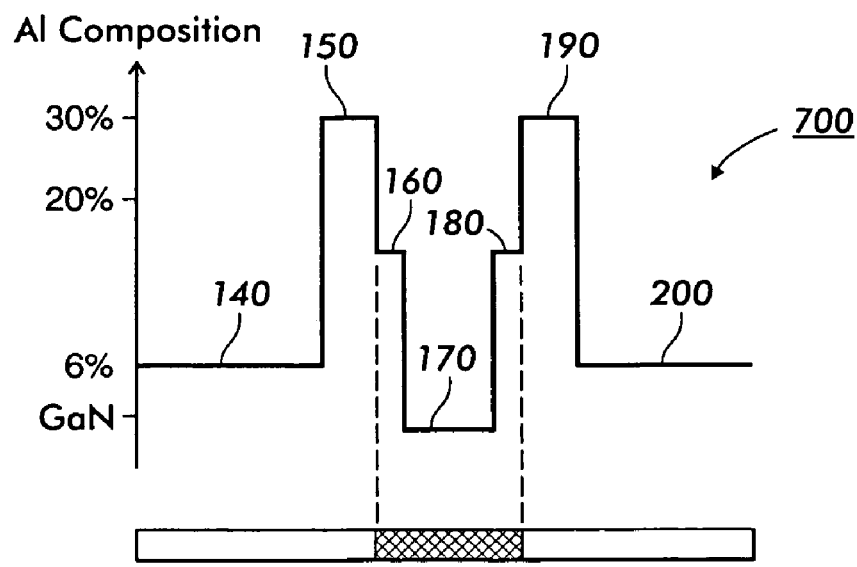
FIG. 7 is a composition profile of a third exemplary embodiment of a UV indium gallium nitride single quantum well active region with adjacent undoped spacer layers according to this invention.

It should be appreciated that the composition of the undoped spacer layers 160 and 180 may also be different from that of the carrier confinement layers 150 and 190. This situation is shown in FIGS. 6 and 7. Since the magnitude of the polarization field in the quantum wells depends on the composition difference at the interface between the spacer layer and the quantum well, a lower Al composition in the part of the spacer layer close to the quantum well will help to reduce the polarization field in the quantum well. The doped current confinement layers below and above the undoped spacer layer will have a higher Al content to prevent carrier leakage. Furthermore, a lower Al content also often translates into a lower background impurity concentration. For example, Al is known to getter oxygen and carbon, leading to higher oxygen and carbon background impurity concentrations in AlGaN layers. Impurities can effect the non-radiative recombination and cause broadening of the quantum well energy levels, both of which will result in reduced gain and higher laser threshold currents. The morphology and structural quality of the spacer layer and consequently the quantum well grown on top of the spacer layer improves with reduced Al content.

FIG. 6 shows an exemplary embodiment of a composition profile of a second exemplary embodiment of an asymmetric single quantum well laser diode structure 600, according to this invention. In this exemplary embodiment, the aluminum content of the p-side carrier confinement layer 190 (which is about 30%) is higher than the aluminum content for the n-side carrier confinement layer 150 (which is about 20%). Furthermore, the aluminum content of the undoped spacer layers 160 and 180 is about 15%, which is different than the aluminum content of either the n-side carrier confinement layer 150 or the p-side carrier confinement layer 190. The Al content in the undoped spacer layers should be high enough to sufficiently contain the electron and hole wavefunctions in the quantum wells without penetrating significantly into the doped current confinement layers. The Al content can be chosen to be lower than the current confinement layers to improve the structural quality and to reduce impurity levels of the spacer layer, and reduce polarization fields in the quantum wells.

FIG. 7 shows an exemplary embodiment of a composition profile of a third exemplary embodiment of a symmetric single quantum well laser diode structure 700 according to this invention, in which the aluminum content (which is about 30%) of the p-side carrier confinement layer 190 is the same as that of the n-side carrier confinement layer 150. As in FIGS. 5 and 6, the n-side waveguide layer 140 and p-side waveguide layer 200 which are outside the carrier confinement layers 150 and 190, have an aluminum content of 6%. As shown both in FIGS. 6 and 7, in general, the aluminum content of the undoped spacer layers 160 and 180 is 5% to 20% lower than that of the carrier confinement layers 150 and 190. This provides sufficient band gap offset of the carrier confinement layers 150 and 190. The thickness of the active region in this single quantum well device may be between about 4 nm and about 20 nm.

Figure 8:
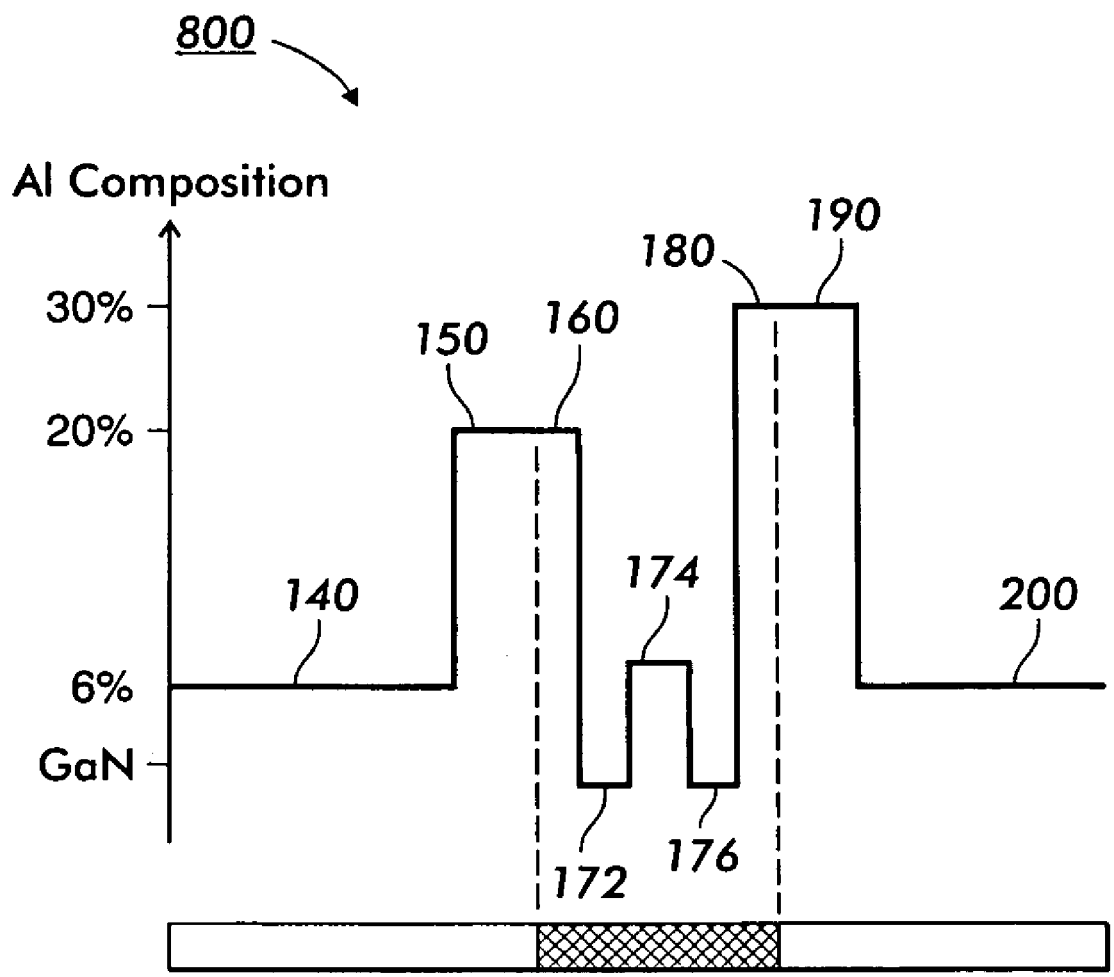
FIG. 8 is a composition profile of one exemplary embodiment of UV indium gallium nitride double quantum well active region with adjacent undoped spacer layers according to this invention.
Figure 9:
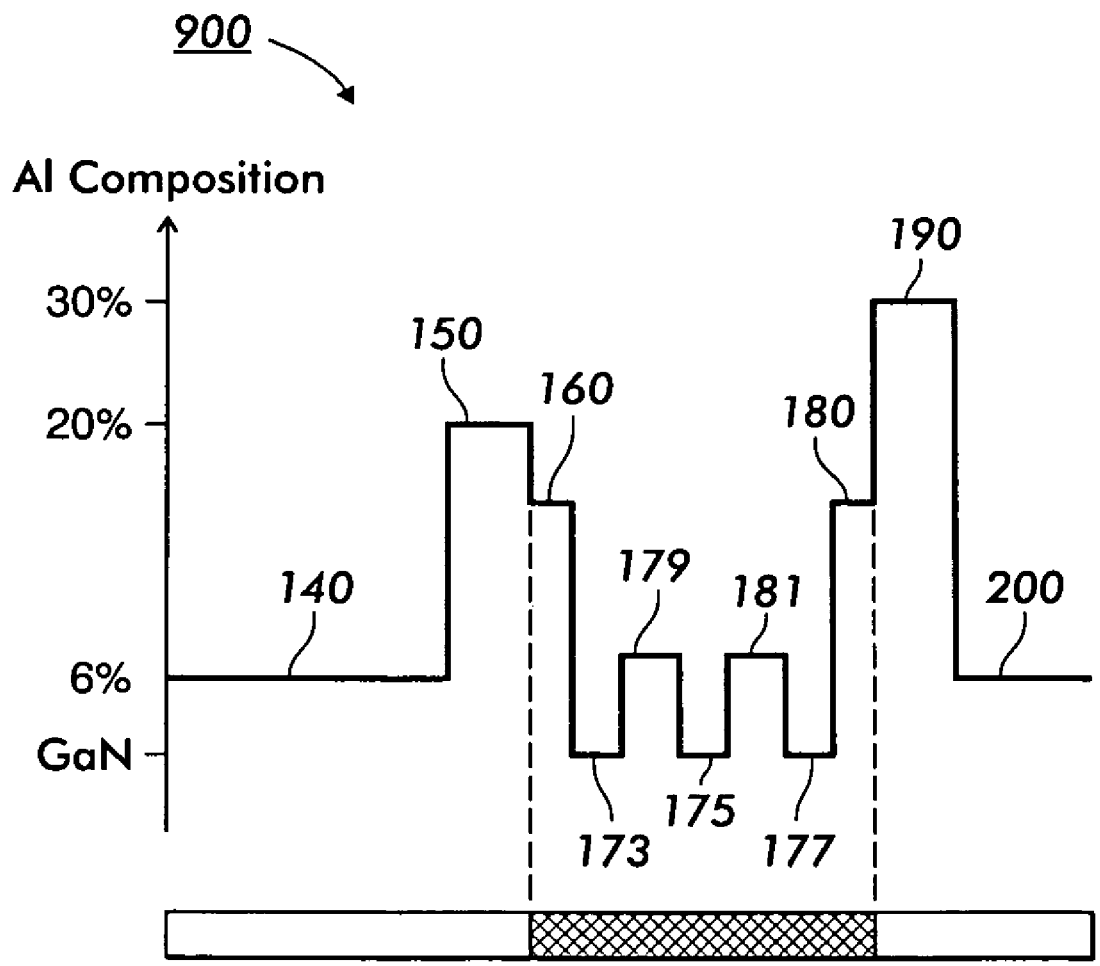
FIG. 9 is a composition profile of one exemplary embodiment of a UV indium gallium nitride triple quantum well active region with adjacent undoped spacer layers according to this invention.

FIG. 8 shows a composition profile of another exemplary embodiment of a closely spaced double quantum well laser diode structure 800 according to this invention. Instead of using a single (In)GaN quantum well, the active region contains two quantum wells 172 and 176 which are separated by a AlGaN barrier layer 174. The thickness and composition of the barrier layer 174 is chosen to allow sufficient coupling between the quantum wells 172 and 176, such that the carriers in the quantum wells can easily redistribute either by tunneling between quantum wells 172 and 176 or by a thermally activated process that allows them to cross the barrier 174. In this example, the composition of the AlGaN barrier is 8% with a thickness of 3–6 nm and a quantum well width of 4 nm. Multiple quantum well active regions can be used with a symmetric confinement or an asymmetric confinement structure, as shown in FIGS. 8 and 9. The advantage of a multiple quantum well region is that it provides more gain, which can be important for high power operation and that it is also less sensitive to polarization fields, because the quantum wells can be made thinner.

FIG. 9 shows an exemplary embodiment of a composition profile of another exemplary embodiment of a closely spaced triple quantum well laser diode structure 900 according to this invention. The active region contains three quantum wells 173, 175 and 177, which are separated by AlGaN barrier layers, 179 and 181. The thickness of the active region may be between about 2 nm to about 20 nm. Again, the thickness and composition of the barrier layer 179 or 181 is chosen to allow sufficient coupling between the quantum wells 173, 175 and 177. The AlGaN barrier layers 179 and 181 can be either undoped, partially doped, with, for example, Si, or completely doped. In the exemplary embodiment shown in FIGS. 8 and 9, the Al composition of the AlGaN barrier is 8% with a barrier thickness of 3–6 nm and a quantum well width of 4 nm. In general, the thickness of the barriers between the multiple quantum wells may be between about 1 nm to about 10 nm thick.

Figure 10:
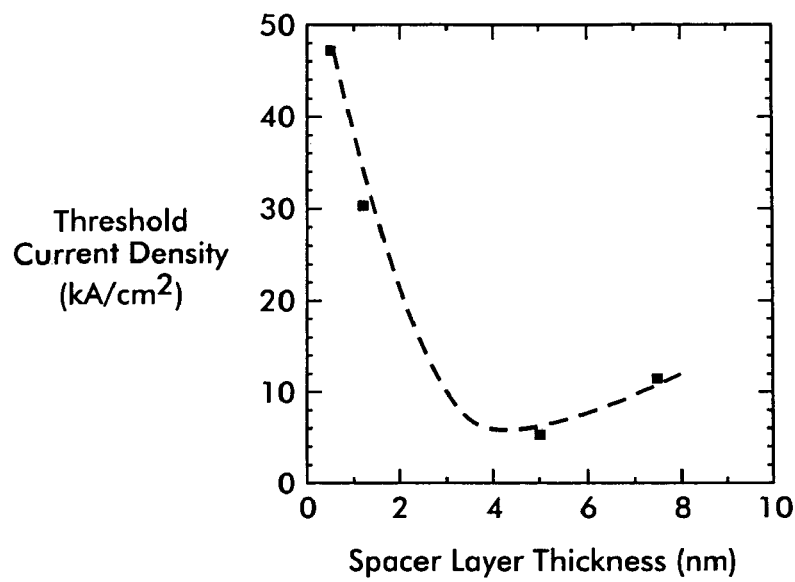
FIG. 10 is a graph of threshold current density versus spacer layer thickness for a UV indium gallium nitride single quantum well laser diode according to this invention.

It should be appreciated that the thickness of the undoped spacer layers 160 and 180 significantly affects the performance of the single quantum well laser diodes 100 and 500–700, as illustrated by FIG. 10. FIG. 10 shows the threshold current density versus spacer layer thickness for a UV indium gallium nitride single quantum well laser diode that has a quantum well active region 170 having a fixed width of 9 nm. As shown in FIG. 10, the threshold current density depends strongly on the thickness of the spacer layers 160 and 180. In this exemplary embodiment, the threshold current density drops dramatically as the spacer layer thickness increases from about 0 nm, until the threshold current density reaches a minimum of around 5 kA/cm$^2$ with a spacer layer thickness of about 4 nm. At thicknesses smaller than 4 nm, the threshold current rapidly increases, due to the effects of dopant-induced lattice defects on the gain of the single quantum well laser diode. At thicknesses greater than 4 nm, the carriers are produced too far away from the single quantum well active region. As a result, many carriers are lost to recombination before reaching the active region, reducing the gain of the single quantum well laser diode. In general, undoped spacer layer thicknesses between about 2 nm and about 20 nm are effective in reducing the threshold current density in single quantum well and multi-quantum well laser devices.

The threshold current density further depends on the thickness of the quantum well active region 170, as shown in Table 1:

TABLE 1

| | |
|---|---|
| 6 nm | NO LASING |
| 7.5 nm | 6 kA/cm$^2$ |
| 9 nm | 5 kA/cm$^2$ |
| 10.5 nm | NO LASING |

Table 1 shows that certain optimal quantum well thicknesses exist, in the range of about 7 nm to about 10 nm for InGaN quantum wells with very low indium content (In percentage less than 5%), that are particularly suited for lasing. As shown by Table 1, the threshold current densities are much higher outside of that range. In various exemplary embodiments, if the quantum well is too thin, i.e., if the thickness is less than about 6 nm, there is not enough modal gain to initiate laser action. In various exemplary embodiments, if the quantum well is too thick, i.e., if the thickness is greater than about 10 nm, the injected carriers may be spatially separated by the residual polarization fields, which also leads to reduced gain and higher laser thresholds. In addition, InGaN films are pseudomorphically strained and may partially relax if they exceed a certain critical thickness, leading to structural degradation and reduced gain. Taken together, FIG. 10 and Table 1 indicate that in various exemplary embodiments, for the specific dimensions shown the lowest threshold current device had a quantum well thickness of 9 nm, and an undoped spacer layer thickness of 4 nm, which yielded a device that achieved lasing at threshold currents of 5 kA/cm$^2$.

Figure 11:
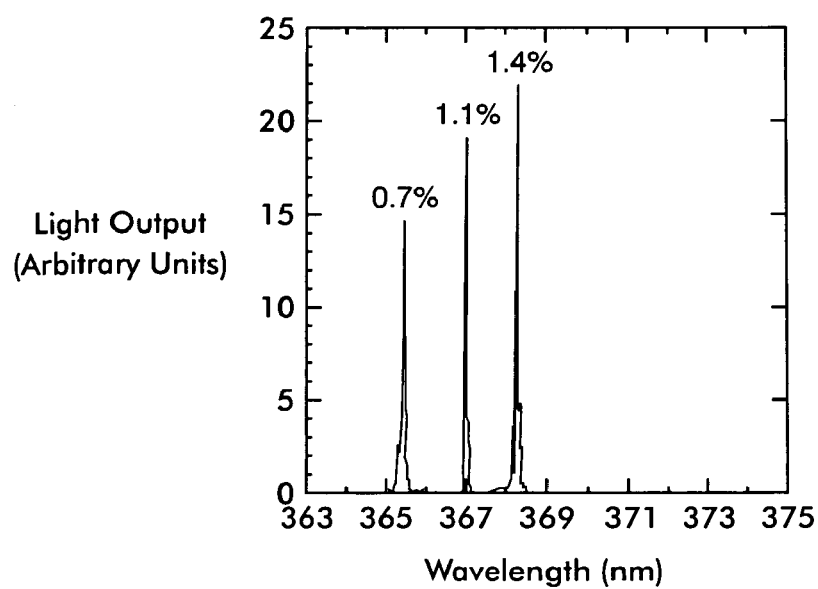
FIG. 11 is a graph showing the emission spectra of indium gallium nitride single quantum well laser diodes, with varying indium composition according to this invention.

FIG. 11 shows high resolution laser emission spectra for various compositions of the In$_x$GaN single quantum well active layer 170. The three emission peaks shown in FIG. 11 correspond to three different indium concentrations, x=0.7%, x=1.1% and x=1.4%. As shown in FIG. 11, the emission wavelength increases with increasing indium content. According to the emission spectra shown in FIG. 11, the shortest wavelength emission (about 365.5 nm) occurred with an indium composition percentage of 0.7%, and the longest wavelength emission (about 368.5 nm) occurred with an indium composition percentage of 1.4%.

Figure 12:
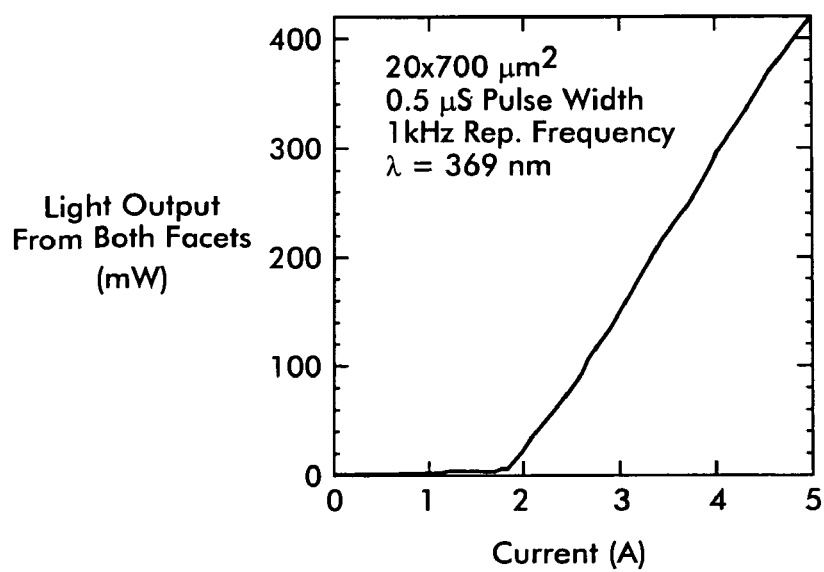
FIG. 12 is a graph plotting the light output verses current characteristic for a UV single quantum well indium gallium nitride laser diode according to this invention.

FIG. 12 shows the light output verses current characteristics of the highest indium content InGaN device (x=1.4%) shown in FIG. 11. In this exemplary embodiment the lowest (pulsed) threshold currents were around 5 kA/cm$^2$, with output powers as high as 400 mW from both facets of the single quantum well InGaN laser diode structure. The experimental parameters leading to these results were a current pulse width of 0.5 μsec at a 1 kHz repetition frequency. The laser wavelength was 369 nm, and the stripe width and cavity length were 20×700 μm$^2$.

While this invention has been described in conjunction with various exemplary embodiments comprising an InGaN single and multiple coupled quantum well heterostructures, exemplary embodiments of laser devices according to this invention are not limited to this material system. Table 2 presents some examples of alternative material systems such as AlGaN and InAlGaN, to which the invention can be applied.

TABLE 2

| ACTIVE REGION | WAVELENGTH |
|---|---|
| In$_x$Ga$_{1-x}$N (x = 2%) | 370 nm |
| In$_y$Al$_x$Ga$_{1-x-y}$N (y = 3%, x = 3%) | 370 nm |
| In$_y$Al$_x$Ga$_{1-x-y}$N (y = 5%, x = 7%) | 370 nm |
| GaN | 363 nm |
| Al$_x$Ga$_{1-x}$N (x = 12%) | 340 nm |
| Al$_x$Ga$_{1-x}$N (x = 46%) | 280 nm |
| Al$_x$Ga$_{1-x}$N (x = 56%) | 265 nm |
| In$_y$Al$_x$Ga$_{1-x-y}$N (y = 2%, x = 16%) | 340 nm |
| In$_y$Al$_x$Ga$_{1-x-y}$N (y = 2%, x = 50%) | 280 nm |
| In$_y$Al$_x$Ga$_{1-x-y}$N (y = 2%, x = 59%) | 265 nm |

Shorter emission wavelengths can be achieved by increasing the aluminum content in the single quantum well active region, from about 12% (with an emission wavelength of 340 nm) to about 59% (with an emission wavelength of 265 nm). It should be appreciated that, for the higher band gap single quantum well active region, the aluminum content of the spacer layers and confinement layers will need to be adjusted accordingly to provide sufficient carrier confinement. Typically, the confinement layer and spacer layers will have an aluminum composition that is higher by about 10% to about 30% compared to that of the spacer layers and confinement layers discussed above.

While this invention has been described in conjunction with the exemplary embodiments outlined above, various alternatives, modifications, variations, improvements, and/or substantial equivalents, whether known or that are or may be presently unforeseen, may become apparent to those having at least ordinary skill in the art. Accordingly, the exemplary embodiments of the invention, as set forth above, are intended to be illustrative, not limiting. Various changes may be made without departing from the spirit and scope of the invention. Therefore, the claims as filed and as they may be amended are intended to embrace all known or later-developed alternatives, modifications variations, improvements, and/or substantial equivalents.

What is claimed is:

1. A III–V semiconductor laser diode, comprising:
   a single or multiple quantum well active region having a p-side and an n-side;
   an n-type carrier confinement layer provided on the n-side of the single or multiple quantum well active region;
   a p-type carrier confinement layer provided on the p-side of the single or multiple quantum well active region; and
   undoped spacer layers provided between the single or multiple quantum well active region and the n-type and p-type carrier confinement layers,
   wherein the each of the n-type and p-type carrier confinement layers and the undoped spacer layers has an aluminum content which is about 10% to about 30% higher than an aluminum content of the quantum well active region.

2. The III–V semiconductor laser diode of claim 1, wherein the single or multiple quantum well active region is one of a GaN single or multiple quantum well active region, an InGaN single or multiple quantum well active region, an InAlGaN single or multiple quantum well active region and an AlGaN single or multiple quantum well active region.

3. The III–V semiconductor laser diode of claim 1, wherein the undoped spacer layers have an aluminum content which is about 0% to about 20% lower than the aluminum content of each of the n-type and p-type carrier confinement layers.

4. The III–V semiconductor laser diode of claim 1, wherein a thickness of each undoped spacer layer is between about 2 nm and about 20 nm.

5. The III–V semiconductor laser diode of claim 4, wherein the thickness of each undoped spacer layer is about 4 nm.

6. The III–V semiconductor laser diode of claim 1, wherein an aluminum content of the p-type carrier confinement layer is different than an aluminum content of the n-type carrier confinement layer.

7. The III–V semiconductor laser diode of claim 1, wherein a thickness of the quantum well active region is between about 4 nm and about 20 nm.

8. The III–V semiconductor laser diode of claim 7, wherein the thickness of the quantum well active region is about 9 nm thick.

9. The III–V semiconductor laser diode of claim 1, wherein a thickness of quantum wells in the multiple quantum well active region is between about 2 nm and about 20 nm.

10. The III–V semiconductor laser diode of claim 9, wherein the thickness of the quantum well in the multiple quantum well active region is about 4 nm thick.

11. The III–V semiconductor laser diode of claim 1, wherein a thickness of barriers between quantum wells in the multiple quantum well active region is between about 1 nm and about 10 nm.

12. The III–V semiconductor laser diode of claim 11, wherein the thickness of the barriers in the multiple quantum well active region is about 6 nm thick.

13. The III–V semiconductor laser diode of claim 11, wherein the n-type carrier confinement layer is doped to a dopant concentration of between about $2\times10^{18}$ cm$^{-3}$ to about $3\times10^{19}$ cm$^{-3}$.

14. The III–V semiconductor laser diode of claim 1, wherein the barriers between quantum wells in the multiple quantum well active region are undoped.

15. The III–V semiconductor laser diode of claim 1, wherein barriers between quantum wells in the multiple quantum well active region are partially or completely Si-doped.

16. The III–V semiconductor laser diode of claim 15, wherein the p-type carrier confinement layer is doped to a dopant concentration of about $1\times10^{19}$ cm$^{-3}$ to about $1\times10^{20}$ cm$^{-3}$.

17. The III–V semiconductor laser diode of claim 1, wherein the n-type carrier confinement layer is doped with at least one of Si, O, Se and Te.

18. The III–V semiconductor laser diode of claim 1, wherein the p-type carrier confinement layer is doped with at least one of Mg, Ca, C and Be.

19. The III–V semiconductor laser diode of claim 1, wherein the single quantum well active region is an InGaN single quantum well active region and the undoped spacer layers and carrier confinement layers comprise InAlGaN.

20. The III–V semiconductor laser diode of claim 1, further comprising:
    a p-type waveguide layer provided adjacent to the p-type carrier confinement layer; and
    an n-type waveguide layer provided adjacent to the n-type carrier confinement layer.

21. The III–V semiconductor laser diode of claim 20, wherein each of the p-type and n-type waveguide layers comprises AlGaN with an aluminum content of about 6%.

22. The III-V semiconductor laser diode of claim 20, further comprising:
    a p-type cladding layer provided adjacent to the p-type waveguide layer; and
    an n-type cladding layer provided adjacent to the n-type waveguide layer.

23. The III-V semiconductor laser diode of claim 22, wherein each of the p-type and the n-type cladding layers comprises AlGaN with an aluminum content of about 13%.

* * * * *